(12) United States Patent
Lee

(10) Patent No.: US 12,022,655 B2
(45) Date of Patent: Jun. 25, 2024

(54) SEMICONDUCTOR DEVICE AND METHOD OF MANUFACTURING SEMICONDUCTOR DEVICE

(71) Applicant: SK hynix Inc., Icheon-si (KR)

(72) Inventor: Hyun Ho Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 283 days.

(21) Appl. No.: 17/314,774

(22) Filed: May 7, 2021

(65) Prior Publication Data
US 2022/0149071 A1   May 12, 2022

(30) Foreign Application Priority Data

Nov. 9, 2020 (KR) ........................ 10-2020-0148739

(51) Int. Cl.
| | | |
|---|---|---|
| *H10B 43/10* | (2023.01) | |
| *H10B 41/27* | (2023.01) | |
| *H10B 43/27* | (2023.01) | |
| *H10B 63/00* | (2023.01) | |

(52) U.S. Cl.
CPC ............ *H10B 43/27* (2023.02); *H10B 41/27* (2023.02); *H10B 63/34* (2023.02); *H10B 63/845* (2023.02)

(58) Field of Classification Search
None
See application file for complete search history.

(56) References Cited

U.S. PATENT DOCUMENTS

| | | | |
|---|---|---|---|
| 9,786,673 B1 * | 10/2017 | Cho | ...................... H01L 23/528 |
| 10,685,978 B1 | 6/2020 | Lu et al. | |
| 2020/0303382 A1 * | 9/2020 | Takashima | .......... H01L 29/7926 |
| 2021/0296338 A1 * | 9/2021 | Han | ...................... H10B 41/10 |

FOREIGN PATENT DOCUMENTS

KR 1020180021563 A 3/2018

* cited by examiner

*Primary Examiner* — Sarah K Salerno
(74) *Attorney, Agent, or Firm* — WILLIAM PARK & ASSOCIATES LTD.

(57) ABSTRACT

A semiconductor device and a method of manufacturing same may include a stack including alternately stacked conductive layers and insulating layers, a separation insulating structure passing through the stack, and including a line pattern, first protrusion patterns protruded from the line pattern to one side, and second protrusion patterns protruded from the line pattern to another side, first channel structures passing through the stack at the one side of the separation insulating structure and surrounding the first protrusion patterns, respectively, and second channel structures passing through the stack at the another side of the separation insulating structure and surrounding the second protrusion patterns, respectively.

16 Claims, 20 Drawing Sheets

SEMICONDUCTOR DEVICE AND METHOD OF MANUFACTURING SEMICONDUCTOR DEVICE

CROSS-REFERENCE TO RELATED APPLICATION

The present application claims priority under 35 U.S.C. § 119(a) to Korean patent application number 10-2020-0148739 filed on Nov. 9, 2020, in the Korean Intellectual Property Office, the entire disclosure of which is incorporated by reference herein.

BACKGROUND

1. Technical Field

The present disclosure relates to an electronic device, and more particularly, to a semiconductor device and a method of manufacturing the semiconductor device.

2. Related Art

Recently, as integration degree improvement of a two-dimensional memory element that forms a memory cell in a single layer on a substrate reaches a limitation, a three-dimensional memory element in which memory cells are vertically stacked on a substrate is being proposed. In addition, various structures and manufacturing methods are being developed to improve operation reliability of a memory element having a three-dimensional structure.

SUMMARY

An embodiment of the present disclosure provides a semiconductor device having a stable structure and an improved characteristic, and a method of manufacturing the semiconductor device.

According to an embodiment of the present disclosure, a semiconductor device may include a stack that may include alternately stacked conductive layers and insulating layers, a separation insulating structure passing through the stack, and may include a line pattern, first protrusion patterns protruded from the line pattern to one side, and second protrusion patterns protruded from the line pattern to another side, first channel structures passing through the stack at the one side of the separation insulating structure and surrounding the first protrusion patterns, respectively, and second channel structures passing through the stack at the another side of the separation insulating structure and surrounding the second protrusion patterns, respectively.

According to an embodiment of the present disclosure, a semiconductor device may include first channel structures passing through a stack, second channel structures passing through the stack, and a separation insulating structure passing through the stack, and may include a line pattern positioned between the first channel structures and the second channel structures, first protrusion patterns protruded from the line pattern into the first channel structures, and second protrusion patterns protruded from the line pattern into the second channel structures.

According to an embodiment of the present disclosure, a method of manufacturing a semiconductor device may include forming a stack including alternately stacked first material layers and second material layers, forming channel structures passing through the stack, forming a trench passing through the stack, and may include forming a line portion extending between the channel structures and protrusion portions protruded from the line portion into the channel structures, and forming a separation insulating structure in the trench.

A semiconductor device having a stable structure and improved reliability may be provided. In addition, in manufacturing a semiconductor device, a procedure may be simplified and cost may be reduced.

DETAILED DESCRIPTION

Specific structural or functional descriptions of embodiments according to the concepts which are disclosed in the present specification or application are illustrated only to describe the embodiments according to the concept of the present disclosure. The embodiments according to the concept of the present disclosure may be carried out in various forms and are not limited to the embodiments described in the present specification or application.

Figure 1A:
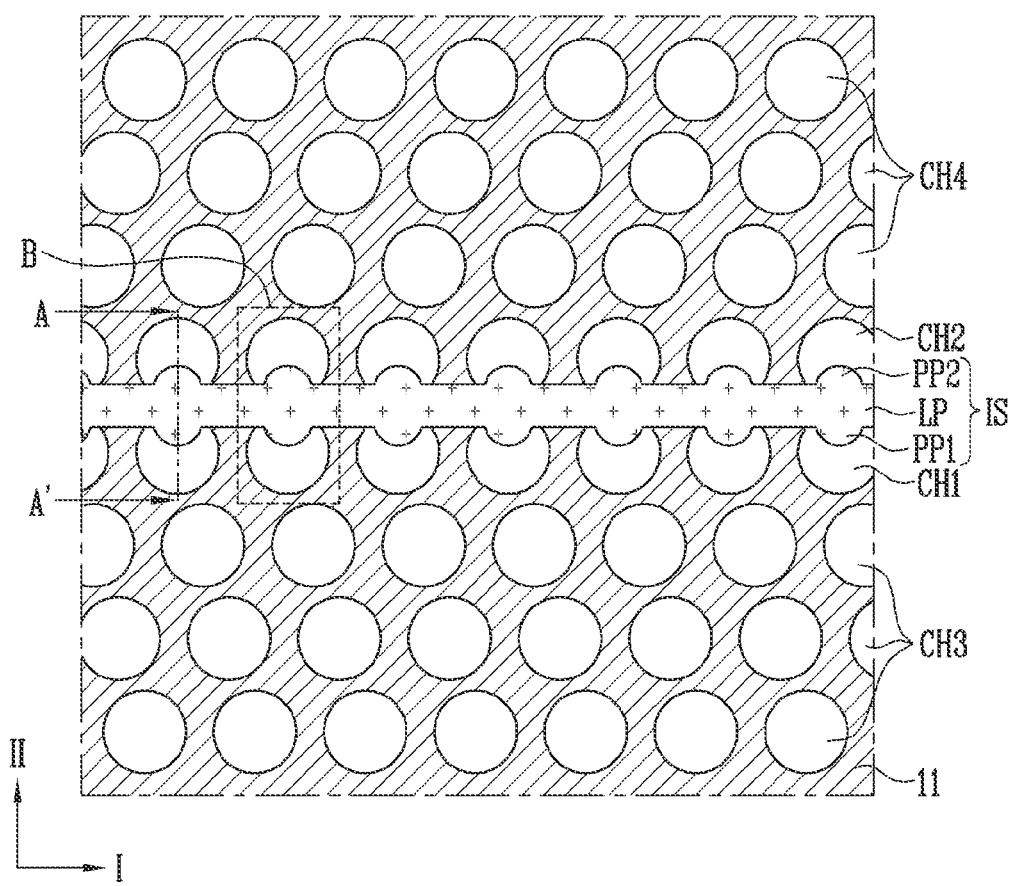
FIGS. 1A, 1B, 1C, and 1D are diagrams illustrating a structure of a semiconductor device according to an embodiment of the present disclosure.
Figure 1B:
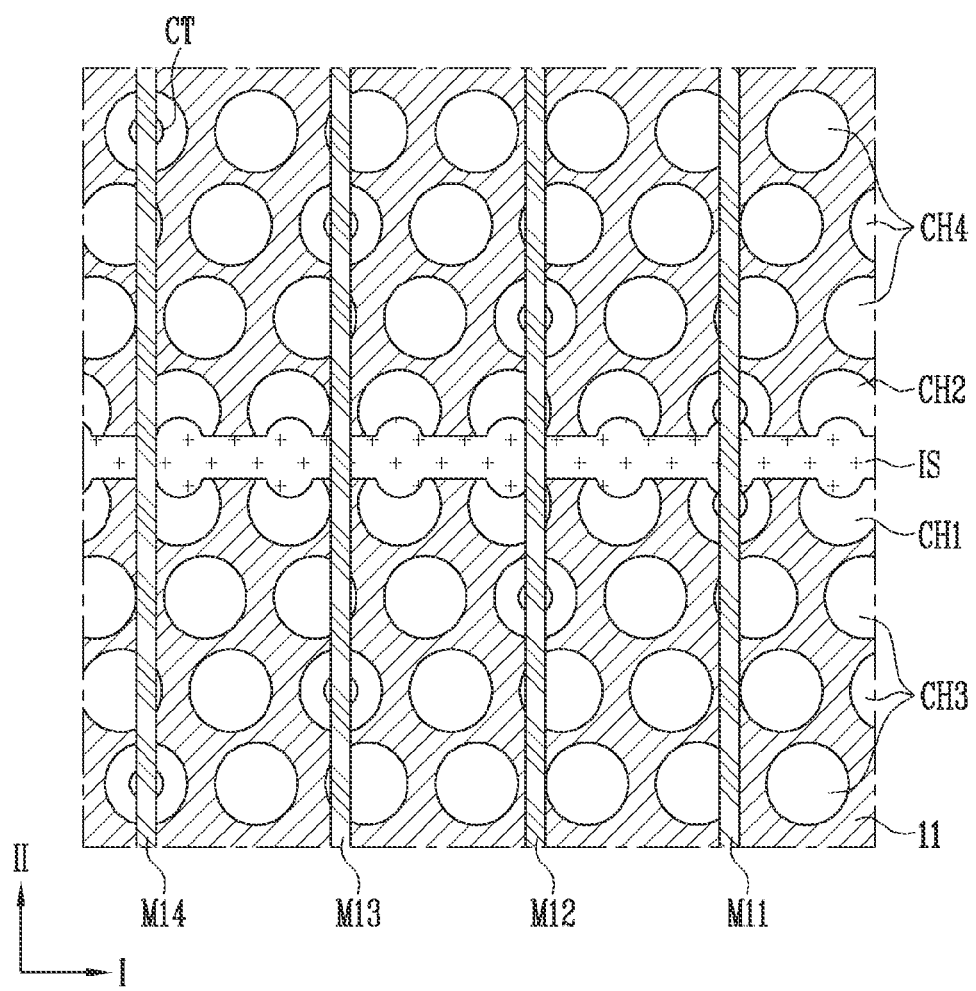
Figure 1C:
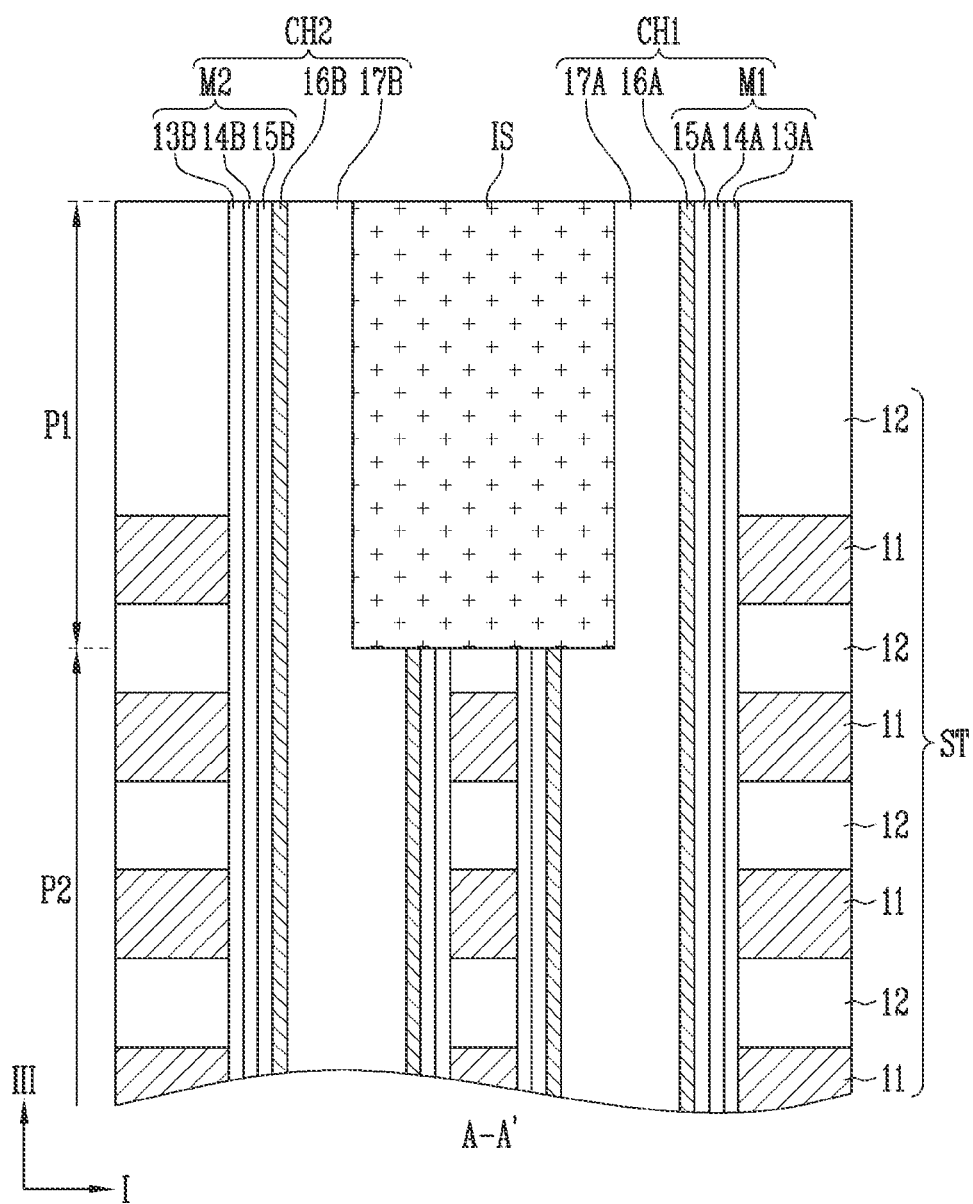
Figure 1D:
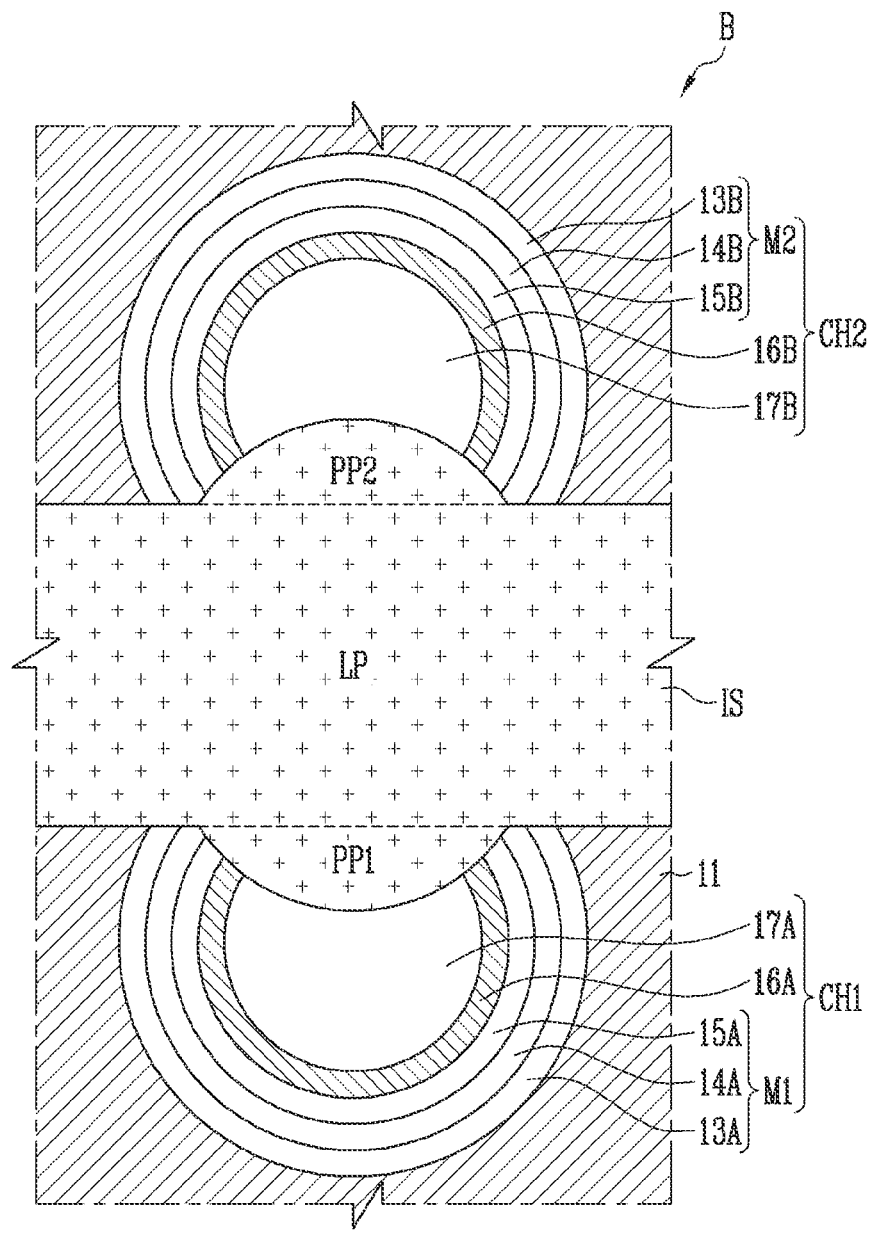

FIGS. 1A to 1D are diagrams illustrating a structure of a semiconductor device according to an embodiment of the present disclosure. FIGS. 1A and 1B are plan views, FIG. 1C is a cross-sectional view taken along a line A-A' of FIG. 1A, and FIG. 1D is an enlarged view of a region B of FIG. 1A.

Referring to FIGS. 1A to 1D, the semiconductor device may include a stack ST, a separation insulating structure IS, first channel structures CH1, and second channel structures CH2.

The stack ST may include alternately stacked conductive layers 11 and insulating layers 12. The conductive layers 11 may be a gate electrode of a memory cell, a select transistor, and the like. As an embodiment, at least one uppermost conductive layer 11 and at least one lowermost conductive layer 11 among the conductive layers 11 may be a lower select line, and the remaining conductive layers 11 may be word lines. The conductive layers 11 may include a conductive material such as polysilicon, tungsten, molybdenum, or another metal. The insulating layers 12 are for insulating the stacked conductive layers 11 from each other. The insulating layers 12 may include an insulating material such as an oxide or nitride.

The first channel structures CH1 and the second channel structures CH2 may pass through the stack ST. Each of the first channel structures CH1 and the second channel structures CH2 may be arranged in a first direction I. The first channel structures CH1 may be arranged in a second direction II crossing the first direction I with the second channel structures CH2. The first channel structures CH1 and the second channel structures CH2 may pass through the stack ST in a third direction III. The third direction III may be a direction protruded from a plane defined by the first direction I and the second direction II. The third direction III may be a stack direction of the conductive layers 11 and the insulating layers 12. The first channel structures CH1 may be arranged symmetrically with the second channel structures CH2.

Each of the first channel structures CH1 may include a first channel layer 16A, and may further include a first memory layer M1 or a first insulating core 17A, or may further include a combination thereof. The first channel layer 16A may be a region in which a channel of a memory cell or a select transistor is formed. The first channel layer 16A may include a semiconductor material such as silicon (Si) or germanium (Ge). The first memory layer M1 may include a blocking layer 13A, a data storage layer 14A, or a tunnel insulating layer 15A, or may include a combination thereof. The data storage layer 14A may include a floating gate, a charge trap material, polysilicon, nitride, or a variable resistance material, or may include a combination thereof. The first insulating core 17A may include an insulating material such as an oxide, nitride, and air gap.

Each of the second channel structures CH2 may include a second channel layer 16B, and may further include a second memory layer M2 or a second insulating core 17B, or may further include a combination thereof. The second channel layer 16B may be a region in which a channel of a memory cell or a select transistor is formed. The second channel layer 16B may include a semiconductor material such as silicon (Si) or germanium (Ge). The second memory layer M2 may include a blocking layer 13B, a data storage layer 14B, or a tunnel insulating layer 15B, or may include a combination thereof. The data storage layer 14B may include a floating gate, a charge trap material, polysilicon, nitride, or a variable resistance material, or may include a combination thereof. The second insulating core 17B may include an insulating material such as an oxide, nitride, and air gap.

The separation insulating structure IS may be positioned between the first channel structures CH1 and the second channel structures CH2, may pass through the stack ST in the third direction III, and may have a depth passing through at least one uppermost conductive layer 11. The separation insulating structure IS may pass through the stack ST at a shallow depth compared to channel structures CH1 to CH4. As an embodiment, the separation insulating structure IS may have a depth that passes through a select line and does not pass through the word line.

The separation insulating structure IS may include a line pattern LP and protrusion patterns PP1 and PP2 protruded from the line pattern LP. The line pattern LP may be positioned between the first channel structures CH1 and the second channel structures CH2, and may extend in the first direction I. The protrusion patterns PP1 and PP2 may be protruded in the second direction II.

The separation insulating structure IS may include the line pattern LP, the first protrusion patterns PP1, and the second protrusion patterns PP2. The first protrusion patterns PP1 may be arranged symmetrically with the second protrusion patterns PP2.

As an embodiment, the first protrusion patterns PP1 may be protruded to one side from the line pattern LP. The first channel structures CH1 may be positioned on one side of the line pattern LP. The first protrusion patterns PP1 may be positioned corresponding to the first channel structures CH1. In the plane defined by the first direction I and the second direction II, the first channel structures CH1 may surround the first protrusion patterns PP1, respectively, and the first protrusion patterns PP1 may be protruded into the first channel structures CH1, respectively.

The first channel structures CH1 may include a first portion P1 and a second portion P2 according to a level. In each of the first channel structures CH1, the first portion P1 may be in contact with the first protrusion patterns PP1, and the second portion P2 may be spaced apart from the first protrusion patterns PP1. In a plane, the second portion P2 may have a shape of a circle, an ellipse, a square, or the like. The first portion P1 may be similar to the second portion P2, and may have a shape in which a portion is cut by the first protrusion pattern PP1. In a plane, the first portion P1 may have an area narrower than that of the second portion P2.

As an embodiment, the second protrusion patterns PP2 may be protruded to another side from the line pattern LP. The second channel structures CH2 may be positioned on the other side of the line pattern LP. The second protrusion patterns PP2 may be positioned corresponding to the second channel structures CH2. In a plane, the second channel structures CH2 may surround the second protrusion patterns PP2, respectively. The second protrusion patterns PP2 may be protruded into the second channel structures CH2, respectively.

The second channel structures CH2 may include a first portion P1 and a second portion P2 according to a level. In each of the second channel structures CH2, the first portion P1 may be in contact with the second protrusion patterns PP2, and the second portion P2 may be spaced apart from the second protrusion patterns PP2. In a plane, the second portion P2 may have a shape of a complete circle, an ellipse, a square, or the like. The first portion P1 may be similar to the second portion P2, and may have a shape in which a portion is cut by the first protrusion pattern PP1. In a plane, the first portion P1 may have an area narrower than that of the second portion P2.

The semiconductor device may further include the third channel structures CH3 and fourth channel structures CH4. The third channel structures CH3 may pass through the stack ST at one side of the separation insulating structure IS, and may be spaced apart from the first protrusion patterns PP1. The fourth channel structures CH4 may pass through the stack ST from another side of the separation insulating structure IS, and may be spaced apart from the second protrusion patterns PP2. The third channel structures CH3 may be arranged symmetrically with the fourth channel structures CH4. Each of the third channel structures CH3 and the fourth channel structures CH4 may include a channel layer, and may further include a memory layer or an insulating core, or may further include a combination thereof.

The semiconductor device may further include contact plugs CT or wires M11 to M14, or may further include a combination thereof, wherein the contact plugs CT may be connected to the channel structures CH1 to CH4, respectively. The channel structures CH1 to CH4 and the wires M11 to M14 may be electrically connected by the contact plugs CT. The wires M11 to M14 may extend in the second direction II, and may be commonly connected to channel structures symmetrically positioned among the first and third channel structures CH1 and CH3 positioned on one side of the separation insulating structure IS and the second and fourth channel structures CH2 and CH4 positioned on the other side of the separation insulating structure IS. As an embodiment, the first wire M11 may be electrically connected to the first channel structure CH1 and the second channel structure CH2. For reference, it should be noted that only a portion of the contact plugs CT or the wires M11 to M14 are shown in FIG. 1B.

According to the structure as described above, the memory cell or the select transistor may be positioned at a position where the channel structures CH1 to CH4 and the conductive layers 11 cross. The memory cell or the select transistor corresponding to the second portion P2 of the first channel structures CH1 and the second channel structures CH2 has a gate all around (GAA) structure in which a gate electrode entirely surrounds a sidewall of the channel layer. The memory cell or the select transistor corresponding to the second portion P2 of the first channel structures CH1 and the second channel structures CH2 may have a shape in which a portion is cut by the separation insulating structure IS, and may be operated as a real memory cell or a real select transistor, not a dummy.

Figure 2A:
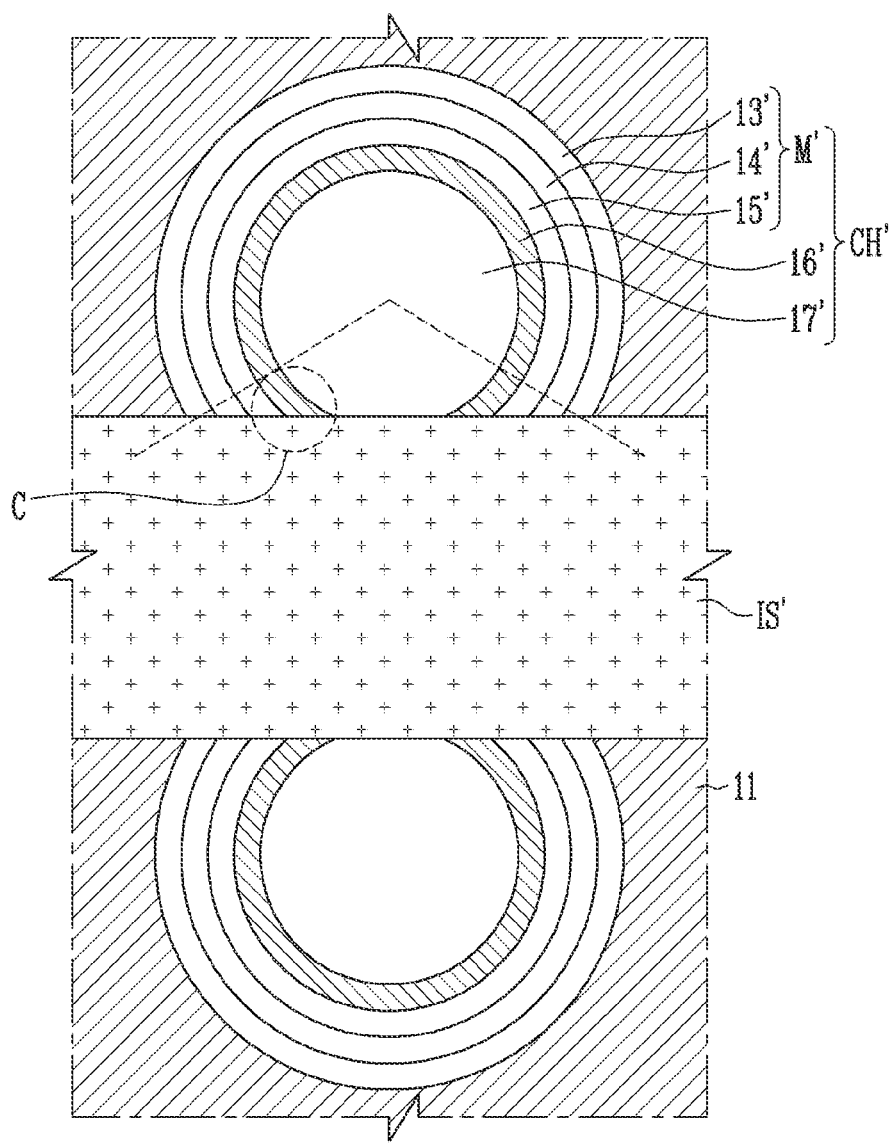
FIGS. 2A and 2B are diagrams illustrating a structure of a semiconductor device according to an embodiment of the present disclosure.
Figure 2B:
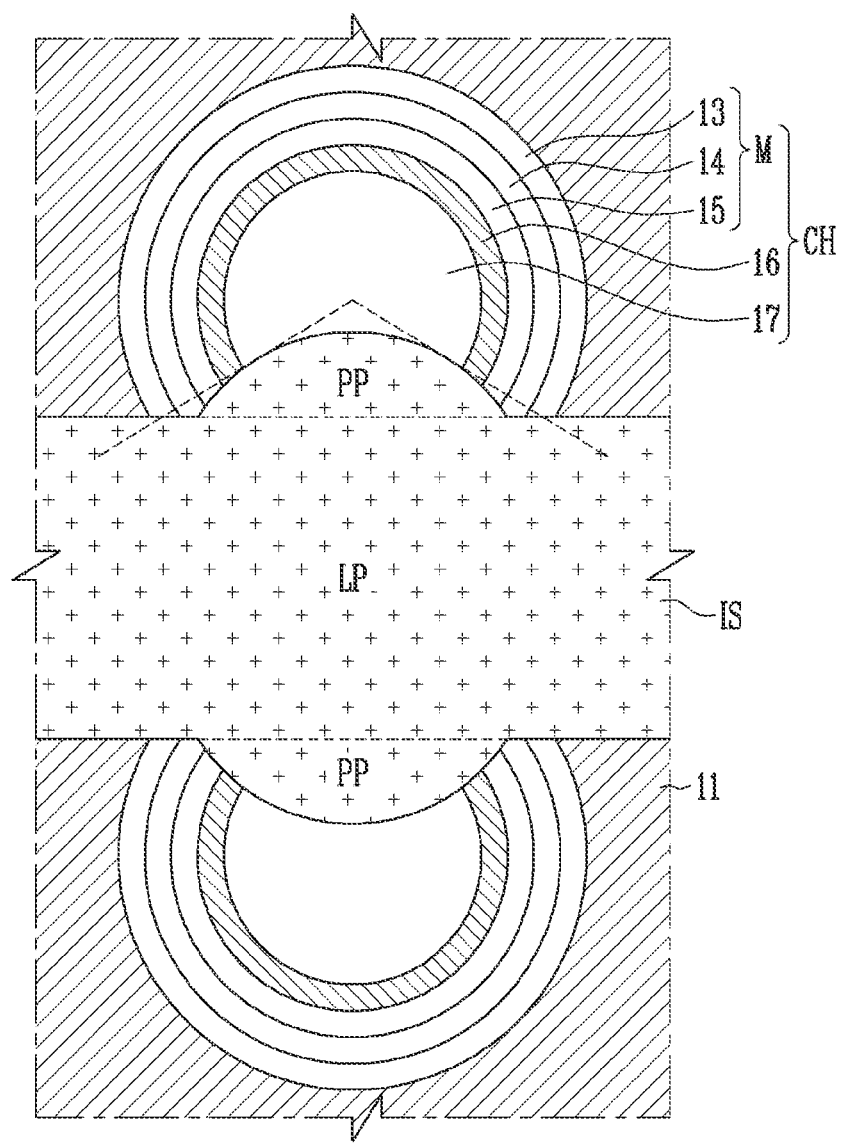

FIGS. 2A and 2B are diagrams illustrating a structure of a semiconductor device according to an embodiment of the present disclosure.

Referring to FIG. 2A, the semiconductor device may include a conductive layer 11, a channel structure CH', and a separation insulating structure IS'. The channel structure CH may include a memory layer M', a channel layer 16', and an insulating core 17'. The memory layer M' may include a blocking layer 13', a data storage layer 14', or a tunnel insulating layer 15', or may include a combination thereof.

The separation insulating structure IS' does not include a protrusion pattern and has a line shape extending in one direction, so that the channel structure CH is cut in a line shape, and the channel layer 16' positioned close to a center of the channel structure CH' is relatively less cut. In this case, since a C region of the channel layer 16' is not covered by the conductive layer 11, a bias applied to the conductive layer 11 may not be sufficiently transferred to the C region during an erase operation or a program operation so that an operation characteristic may deteriorate, such as an operation speed may slow down.

Referring to FIG. 2B, the semiconductor device may include a conductive layer 11, a channel structure CH, and a separation insulating structure IS. The channel structure CH may include a memory layer M, a channel layer 16 and an insulating core 17. The memory layer M may include a blocking layer 13, a data storage layer 14, or a tunnel insulating layer 15, or may include a combination thereof. The separation insulating structure IS may include a line pattern LP and protrusion patterns PP, so that the channel layer 16 may be further cut by the protrusion pattern PP. Comparing FIGS. 2A and 2B, the region C of the channel structure CH' may be cut by the protrusion pattern PP, so that the channel layer 16 may be entirely covered by the conductive layer 11. In addition, during an erase operation or a program operation, a bias applied to the conductive layer 11 may be sufficiently transferred to the channel layer 16.

Figure 3A:
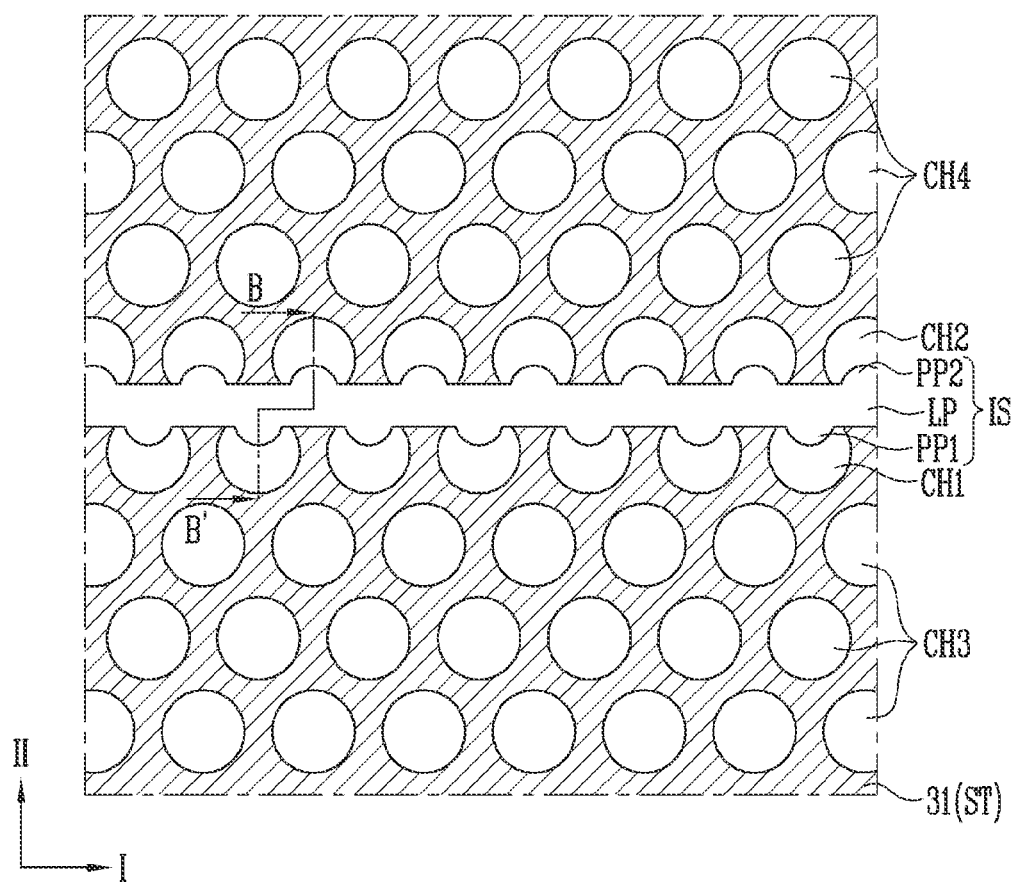
FIGS. 3A and 3B are diagrams illustrating a structure of a semiconductor device according to an embodiment of the present disclosure.
Figure 3B:
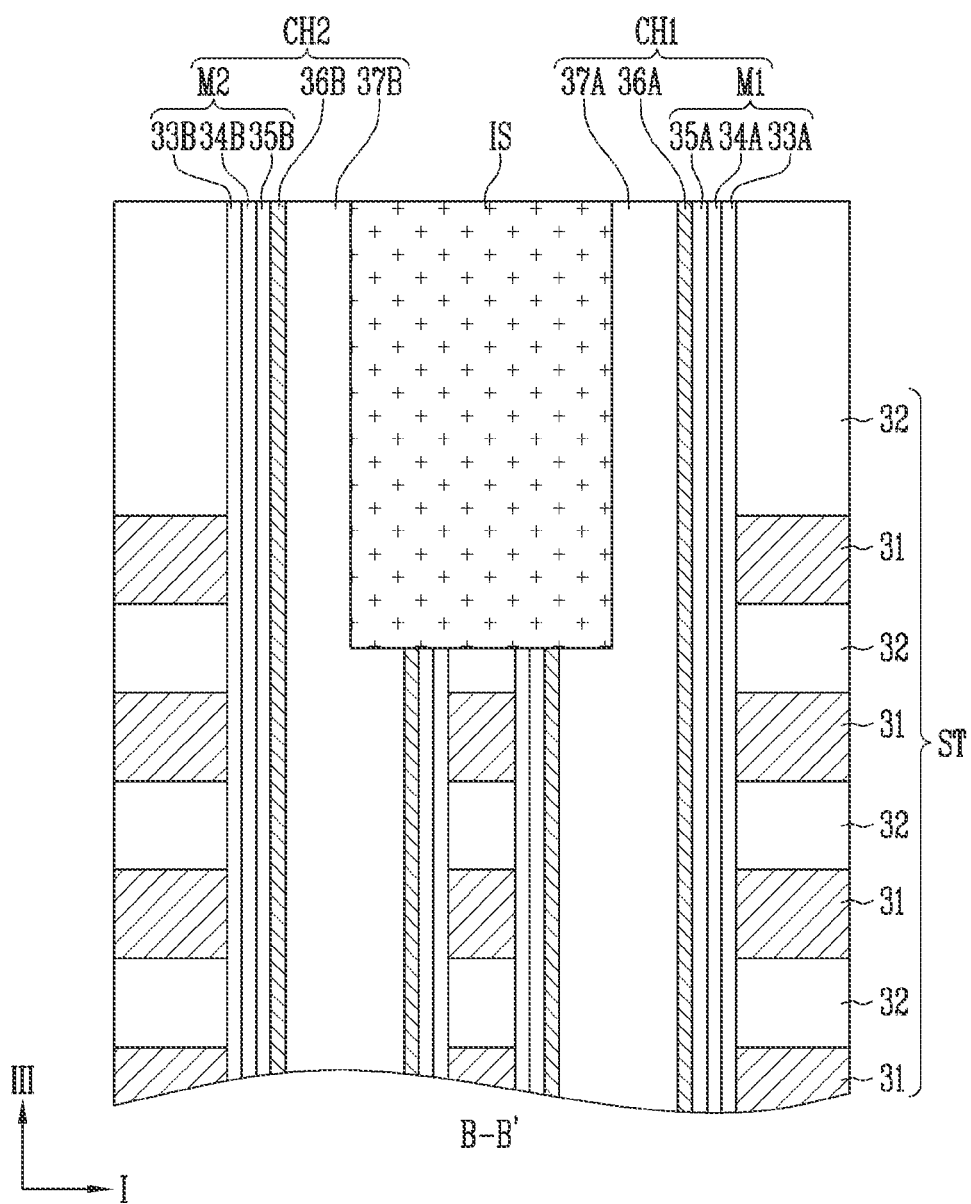

FIGS. 3A and 3B are diagrams illustrating a structure of a semiconductor device according to an embodiment of the present disclosure. FIG. 3B may be a cross-sectional view taken along a line B-B' of FIG. 3A. Hereinafter, contents repetitive to the previously described contents are omitted.

Referring to FIGS. 3A and 3B, the semiconductor device may include a stack ST, a separation insulating structure IS, first channel structures CH1, and second channel structures CH2. The semiconductor device may further include third channel structures CH3 or fourth channel structures CH4, or may further include a combination thereof.

The stack ST may include alternately stacked conductive layers 31 and insulating layers 32. Each of the first channel structures CH1 may include a first channel layer 36A, and may further include a first memory layer M1 or a first insulating core 37A, or may further include a combination thereof. The first memory layer M1 may include a blocking layer 33A, a data storage layer 34A, or a tunnel insulating layer 35A, or may include a combination thereof. Each of the second channel structures CH2 may include a second channel layer 36B, and may further include a second memory layer M2 or a second insulating core 37B, or may further include a combination thereof. The second memory layer M2 may include a blocking layer 33B, a data storage layer 34B, or a tunnel insulating layer 35B, or may include a combination thereof.

The separation insulating structure IS may be positioned between the first channel structures CH1 and the second channel structures CH2. The first channel structures CH1 may be positioned on one side of the separation insulating structure IS, and the second channel structures CH2 may be positioned on another side of the separation insulating structure IS. Based on the separation insulating structure IS, the first channel structures CH1 and the second channel structures CH2 may be arranged asymmetrically.

The separation insulating structure IS may include a line pattern LP, first protrusion patterns PP1, and second protrusion patterns PP2 protruded from the line pattern LP. The first protrusion patterns PP1 may be arranged asymmetrically with the second protrusion patterns PP2. The first channel structures CH1 may surround the first protrusion patterns PP1, respectively, and the first protrusion patterns PP1 may be protruded into the first channel structures CH1, respectively. The second channel structures CH2 may surround the second protrusion patterns PP2, respectively, and the second protrusion patterns PP2 may be protruded into the second channel structures CH2, respectively.

The third channel structures CH3 may be spaced apart from the first protrusion patterns PP1 and may be positioned on one side of the separation insulating structure IS. The fourth channel structures CH4 may be spaced apart from the second protrusion patterns PP2 and may be positioned on another side of the separation insulating structure IS. The third channel structures CH3 may be arranged asymmetrically with the fourth channel structures CH4.

According to the structure as described above, the memory cell or the select transistor may operate as a real memory cell or a real select transistor rather than a dummy even though a memory cell or a select transistor has a shape in which a portion is cut by the separation insulating structure IS. In addition, by arranging the first to fourth channel structures CH1 to CH4 asymmetrically, an integration degree of the semiconductor device may be improved.

FIGS. 4A to 7A and 4B to 7B are diagrams illustrating a method of manufacturing a semiconductor device according to an embodiment of the present disclosure. FIG. B of each number is a cross-sectional view taken along a line C-C' of FIG. A.

Figure 4A:
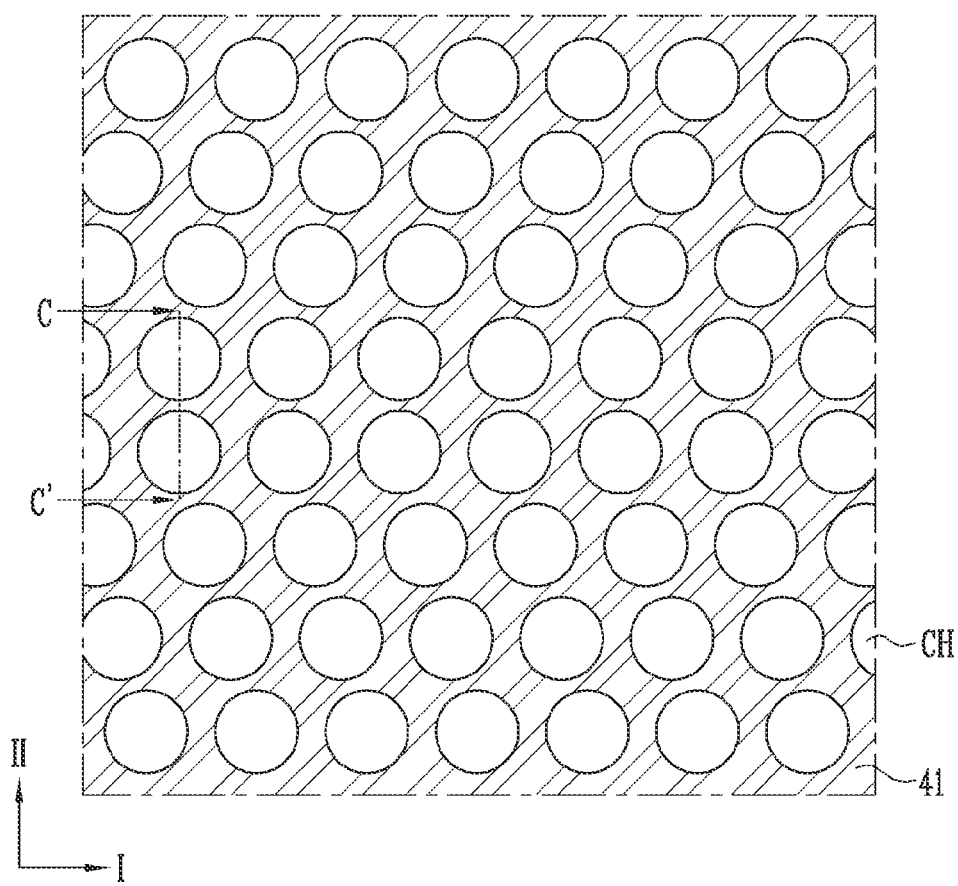
FIGS. 4A, 5A, 6A, 7A and 4B, 5B, 6B, 7B are diagrams illustrating a method of manufacturing a semiconductor device according to an embodiment of the present disclosure.
Figure 4B:
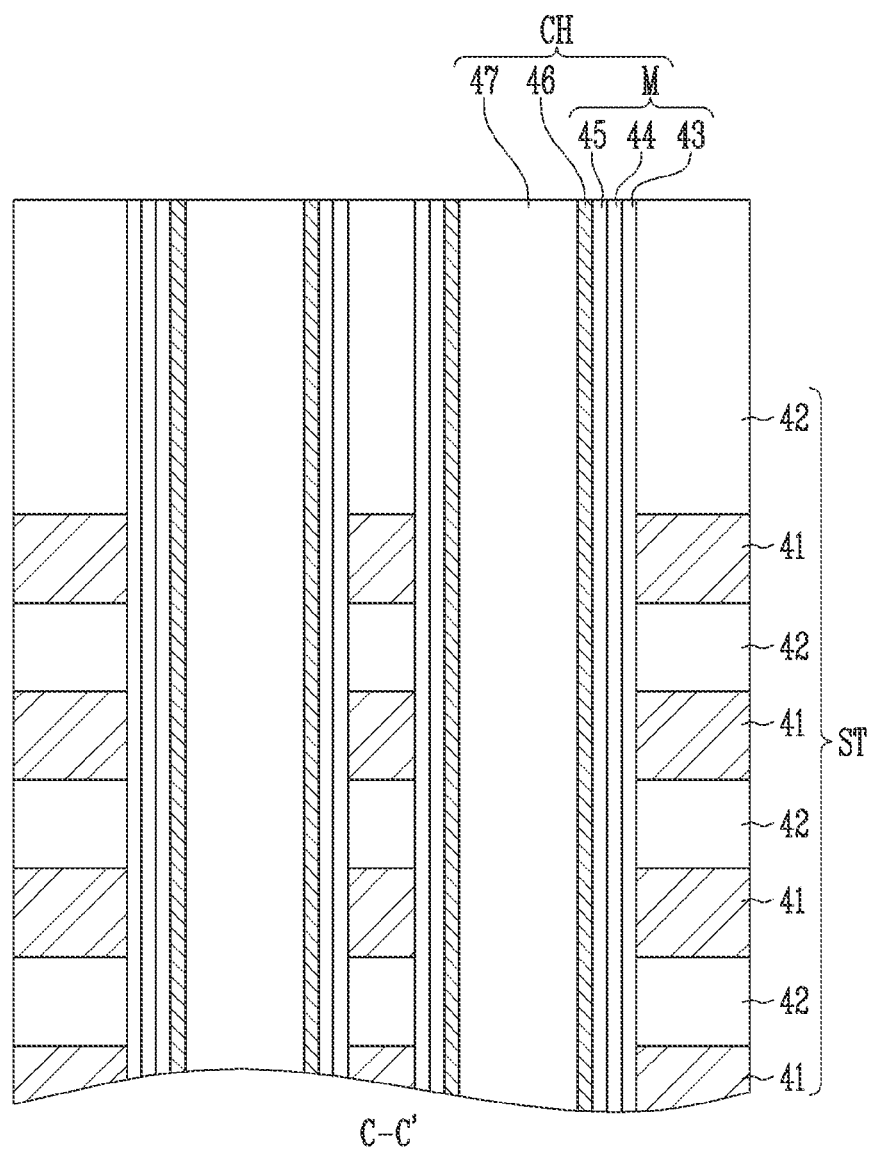

Referring to FIGS. 4A and 4B, a stack ST is formed, wherein the stack ST may include alternately stacked first material layers 41 and second material layers 42. The first material layers 41 may include a material having, with respect to the second material layers 42, a high etch selectivity. For example, the first material layers 41 may include a sacrificial material such as nitride, and the second material layers 42 may include an insulating material such as oxide. As another example, the first material layers 41 may include a conductive material such as polysilicon, tungsten, and molybdenum, and the second material layers 42 may include an insulating material such as oxide.

Subsequently, channel structures CH passing through the stack ST are formed. After forming openings passing through the stack, the channel structures CH may be formed in the openings. As an embodiment, the memory layer M may be formed in the opening and a channel layer 46 may be formed in the memory layer M. The memory layer M may include a blocking layer 43, a data storage layer 44, or a tunnel insulating layer 45, or may include a combination thereof. The openings may be completely filled with the channel layer 46 or an insulating core 47 may be formed in the channel layer 46.

Referring to FIGS. 5A to 6B, a trench T passing through the stack ST is formed. Using a mask pattern 48, the trench T may be formed by an etching process.

Figure 5A:
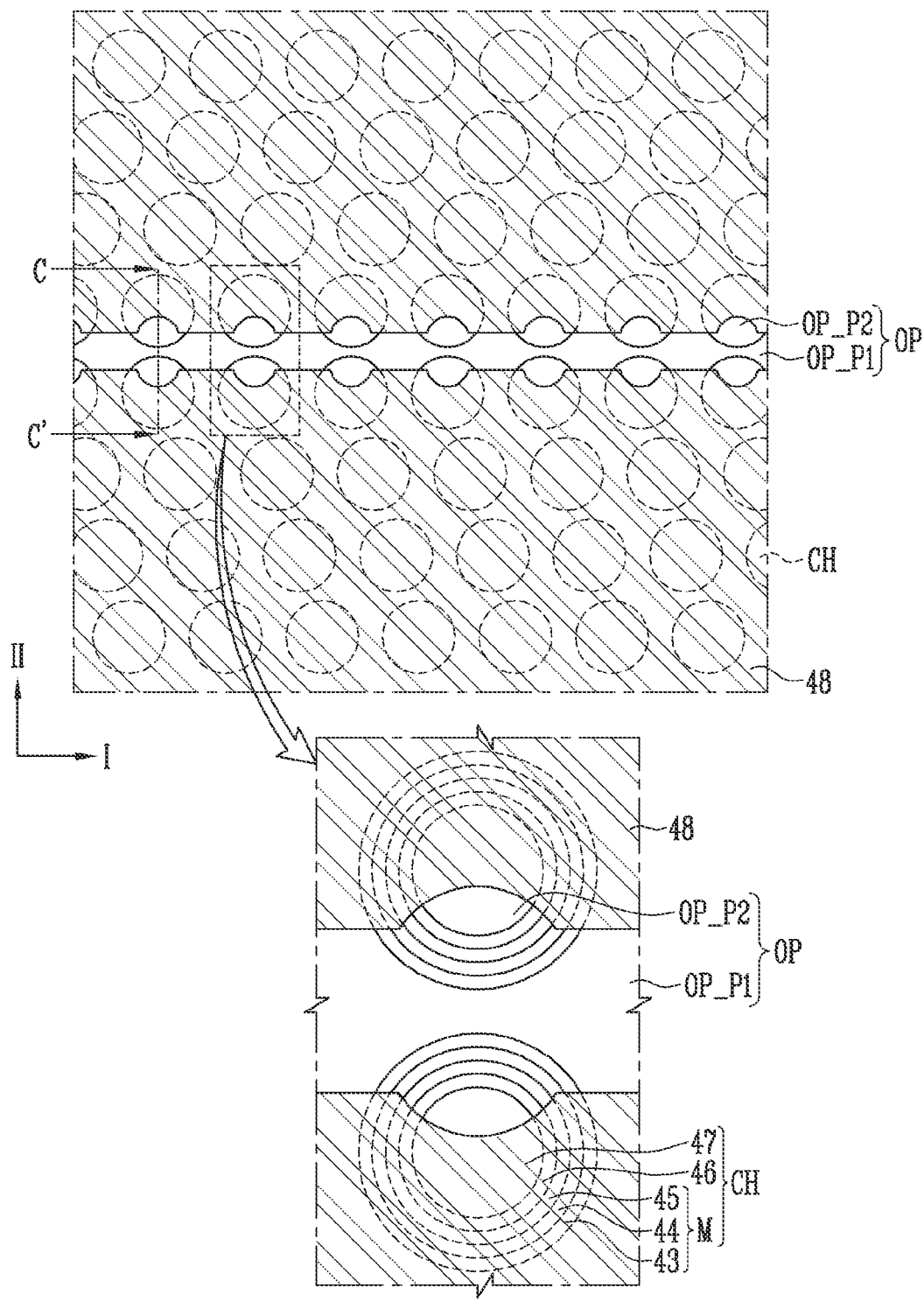
Figure 5B:
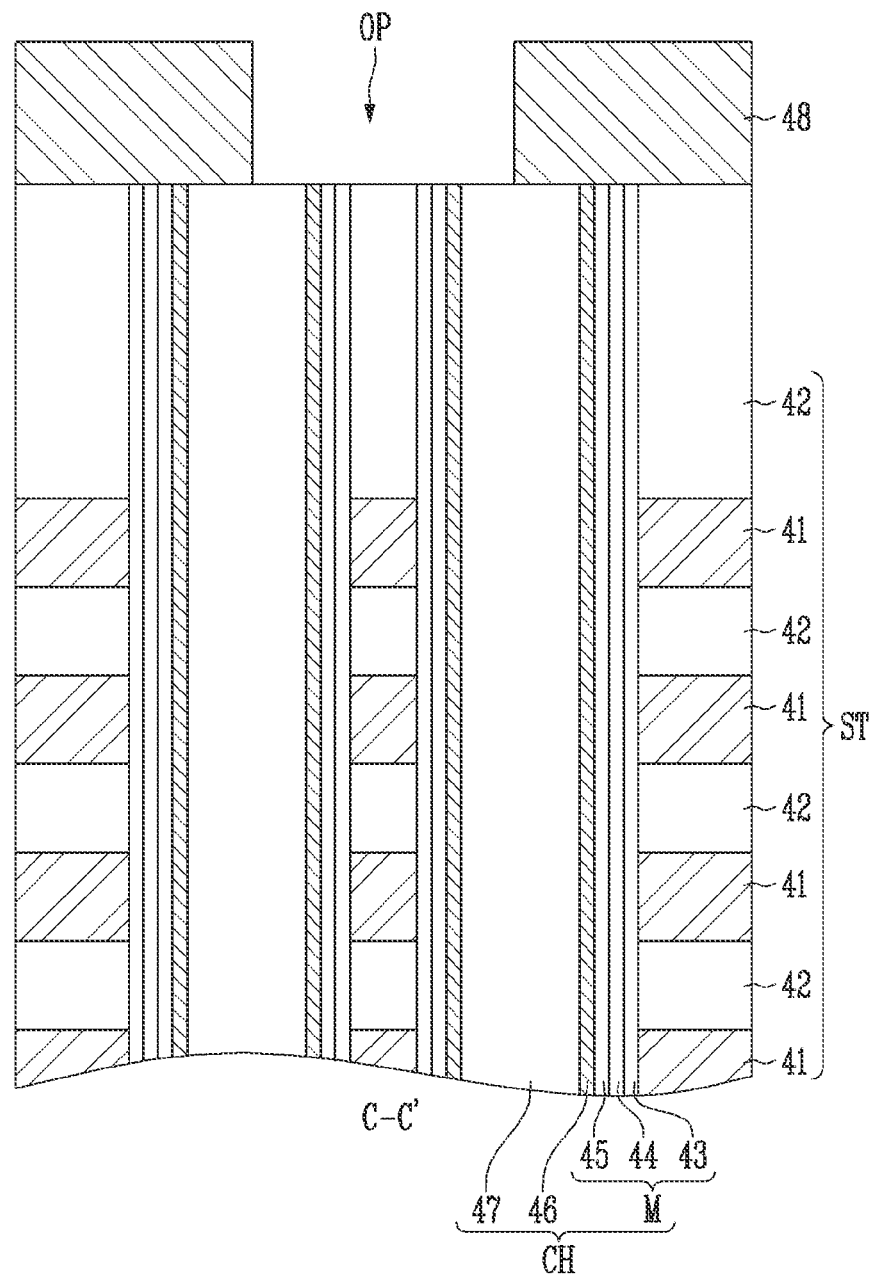

First, referring to FIGS. 5A and 5B, the mask pattern 48 is formed on the stack ST. The mask pattern 48 may include a material having a high etch selectivity with respect to the first material layers 41 and the second material layers 42.

The mask pattern 48 may include an opening OP including a first portion OP_P1 and second portions OP_P2. The first portion OP_P1 may have a line shape extending in a first direction I, may be positioned between channel structures CH adjacent in a second direction II, and may expose the stack ST. The channel structures CH positioned on both sides of the first portion OP_P1 may be partially exposed by the first portion OP_P1. The first portion OP_P1 may partially overlap the channel structures CH of both skies in the second direction II.

The second portions OP_P2 may be protruded in the second direction II from the first portion OP_P1, and may be positioned to correspond to the channel structures CH, respectively. Each of the second portions OP_P2 may expose a portion of each of the channel structures CH. The channel layers may be exposed by the second portions OP_P2. The insulating cores 47 or the memory layers M may be further exposed by the second portions OP_P2.

Figure 6A:
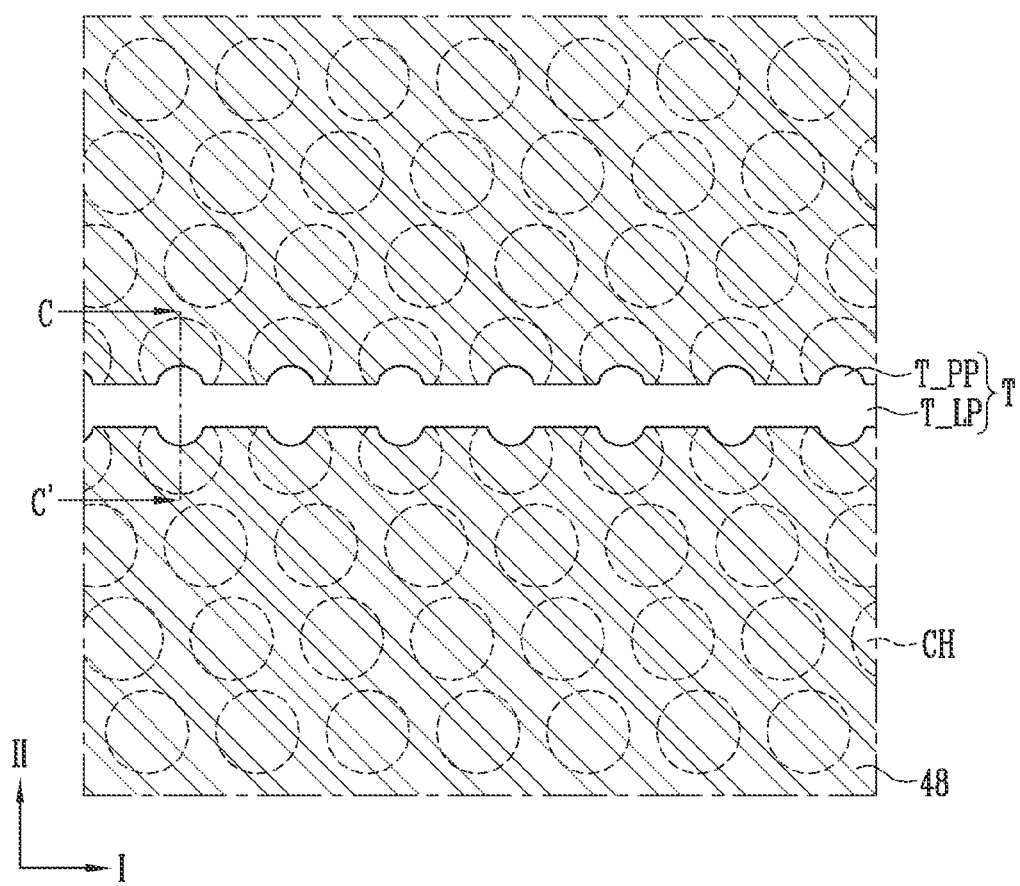
Figure 6B:
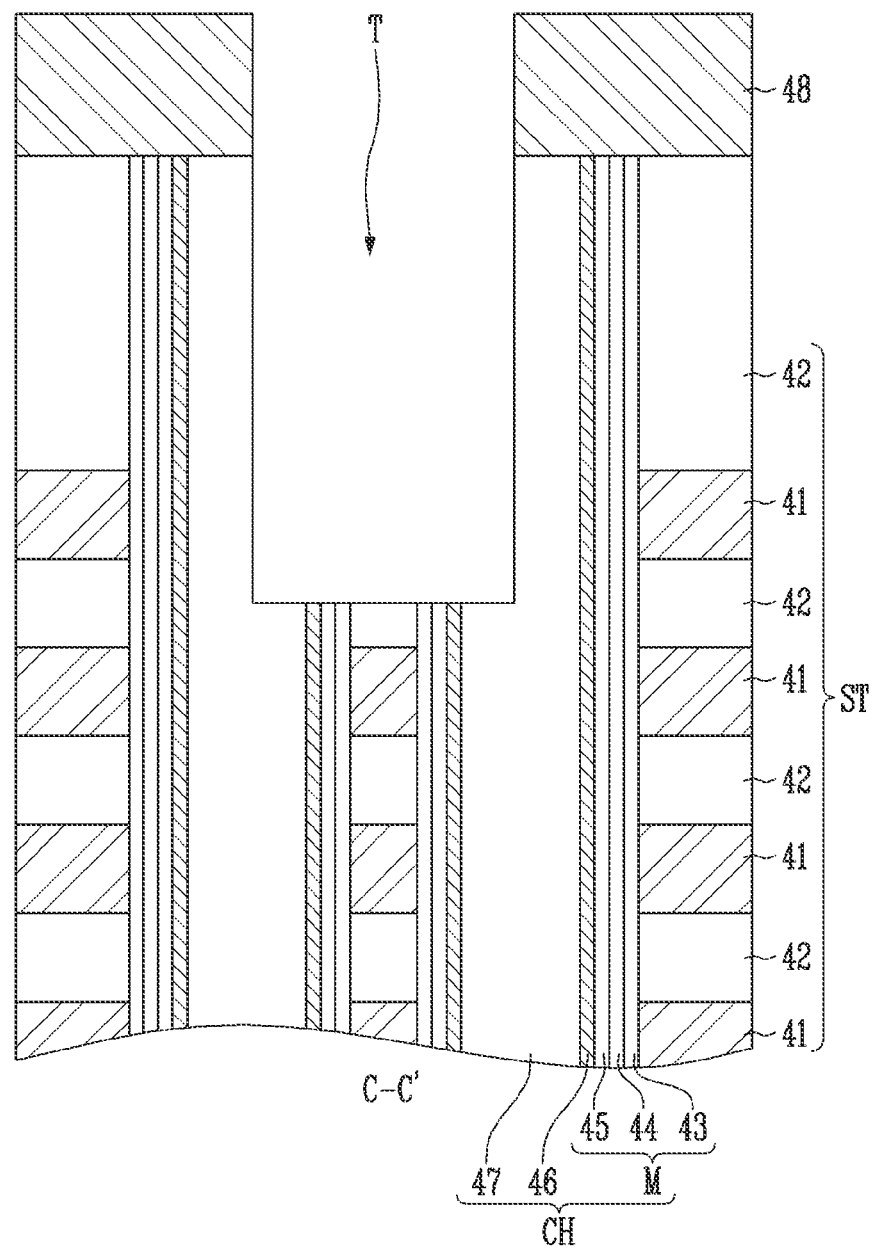

Subsequently, referring to FIGS. 6A and 6B, the trench T is formed. By etching the stack ST and the channel structures CH by using the mask pattern 48 as an etch barrier, the trench T may be formed. The trench T may be formed at a depth passing through at least one uppermost first material layer 41. As an embodiment, the trench T may be formed at a depth that passes through the first material layer 41 corresponding to the select line among the first material layers and does not pass through the first material layer 41 corresponding to the word line.

The trench T may have a shape corresponding to the opening OP, and may include a line portion T_LP and protrusion portions T_PP. The line portion T_LP may have a line shape extending in the first direction I, and may extend between the channel structures CH adjacent in the second direction II. The protrusion portions T_PP may be protruded from the line portion T_LP in the second direction II, and may be protruded into the channel structures CH, respectively. A region of the channel layers 46, which is not surrounded by the first material layers 41, may be cut by the protrusion portions T_PP.

Figure 7A:
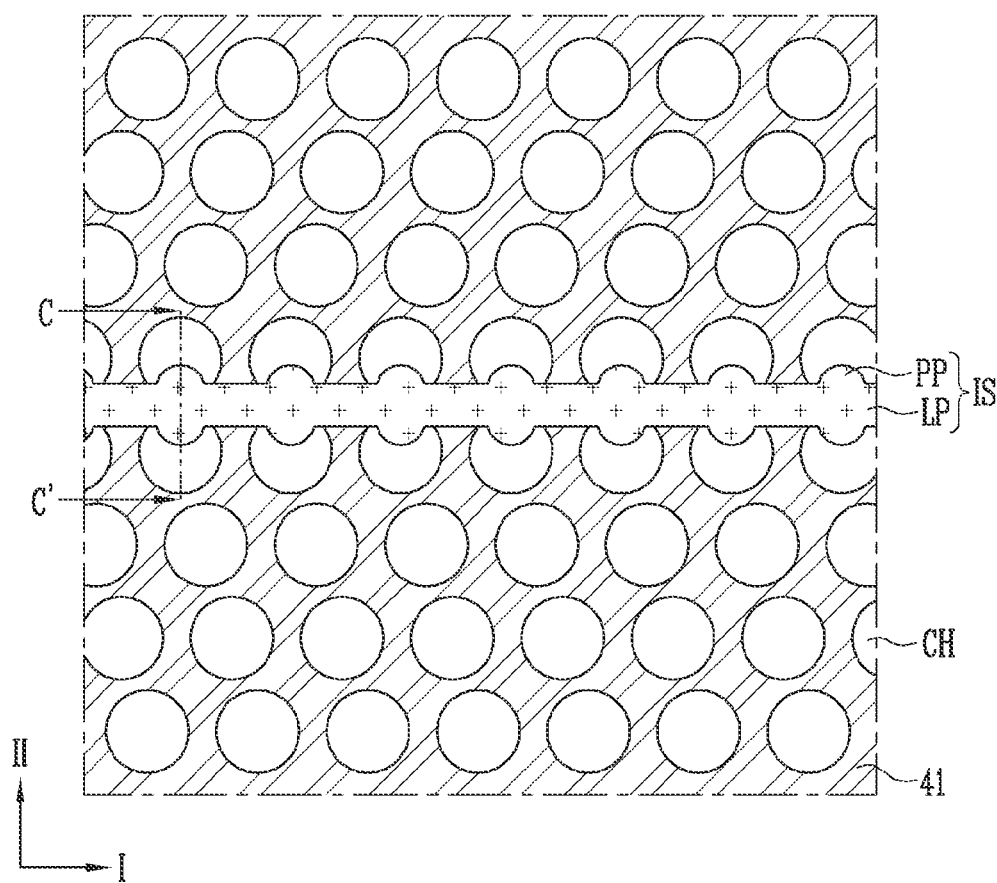
Figure 7B:
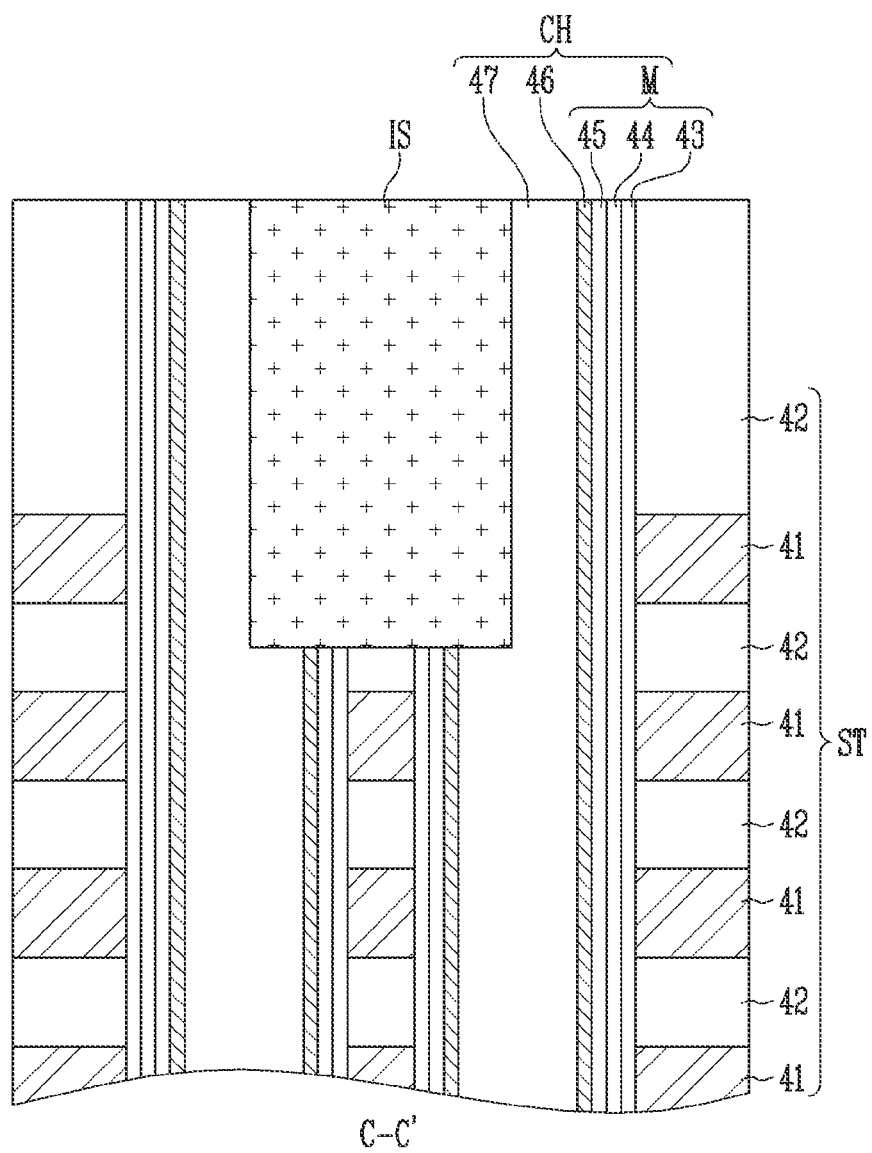

Referring to FIGS. 7A and 7B, a separation insulating structure IS is formed. After an insulating layer is formed to fill the trench T, the separation insulating structure IS may be formed by planarizing the insulating layer, wherein the separation insulating structure IS may include an insulating material such as oxide or nitride.

The separation insulating structure IS may include a line pattern LP and protrusion patterns PP. The line pattern LP may extend between the channel structures CH and may extend in the first direction I. The protrusion patterns PP may be protruded from the line pattern LP and may be protruded into the channel structures CH, respectively.

For reference, although not shown in the present figure, a process of replacing the first material layers 41 with third material layers may be additionally performed. When the first material layers 41 include a sacrificial material and the second material layers 42 include an insulating material, the first material layers 41 may be replaced with conductive layers. As another example, when the first material layers 41 include a conductive material and the second material layers 42 include an insulating material, the first material layers 41 may be silicided. The process of replacing the first material layers 41 with the third material layers may be performed before forming the separation insulating structure IS or may be performed after forming the separation insulating structure IS.

According to the manufacturing method as described above, using the mask pattern 48, the stack ST and the channel structures CH may be etched. Therefore, the line portion T_LP and the protrusion portions T_PP may be simultaneously formed in one etching process. Simultaneously with patterning the first material layers 41 by the line portion T_LP, the region that is not surrounded by the first material layers 41 among the channel layers 46 may be removed.

Figure 8:
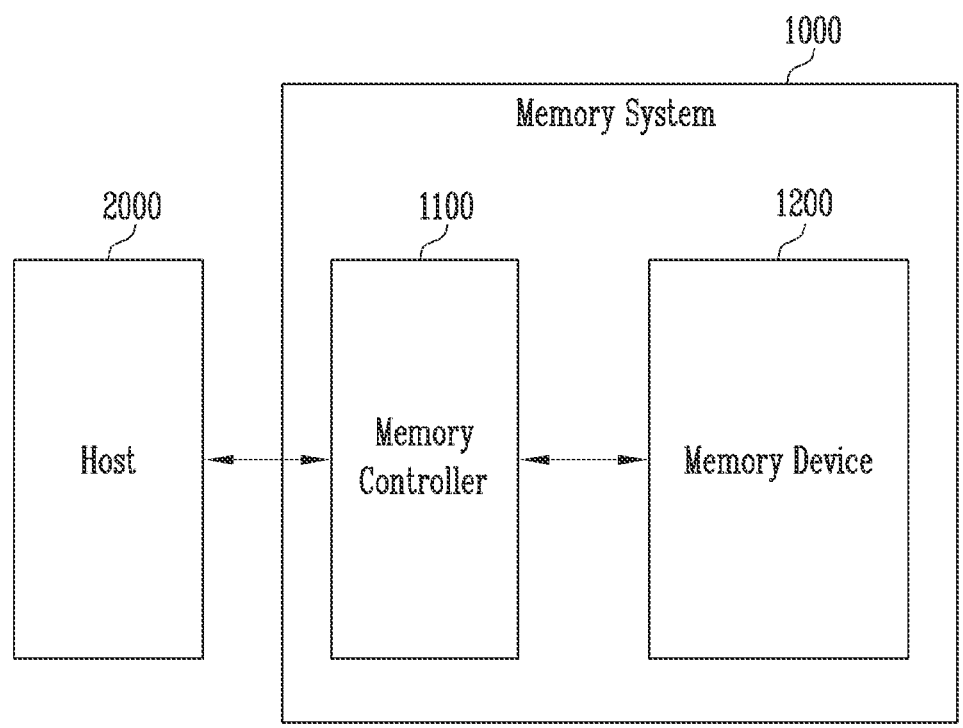
FIG. 8 is a block diagram illustrating a memory system according to an embodiment of the present disclosure.

FIG. 8 is a diagram illustrating a memory system according to an embodiment of the present disclosure.

Referring to FIG. 8, the memory system 1000 may include a memory device 1200 in which data is stored, and a controller 1100 communicating between the memory device 1200 and a host 2000.

The host 2000 may be a device or system that stores data in the memory system 1000 or retrieves data from the memory system 1000. The host 2000 may generate requests for various operations and may output the generated requests to the memory system 1000. The requests may include a program request for a program operation, a read request for a read operation, an erase request for an erase operation, and the like. The host 2000 may communicate with the memory system 1000 through various interfaces such as peripheral component interconnect express PCIe), advanced technology attachment (ATA), serial ATA (SATA), parallel ATA (DATA), serial attached SCSI (SAS), nonvolatile memory express (NVMe), universal serial bus (USB), multi-media card (MMC), enhanced small disk interface (ESDI), or integrated drive electronics (IDE).

The host 2000 may include at least one of a computer, a portable digital device, a tablet, a digital camera, a digital audio player, a television, a wireless communication device, or a cellular phone, but embodiments of the present disclosure are not limited thereto.

The controller 1100 may generally control an operation of the memory system 1000, wherein the controller 1100 may control the memory device 1200 according to the request of the host 2000. The controller 1100 may control the memory device 1200 so that the program operation, the read operation, the erase operation, and the like may be performed according to the request of the host 2000. Alternatively, even though the request of the host 2000 does not exist, the controller 1100 may perform a background operation or the like for improving performance of the memory system 1000.

In order to control the operation of the memory device 1200, the controller 1100 may transmit a control signal and a data signal to the memory device 1200. The control signal and the data signal may be transmitted to the memory device 1200 through different input/output lines. The data signal may include a command, an address, or data. The control signal may be used to divide a section in which the data signal is input.

Under the control of the controller 1100, the memory device 1200 may perform the program operation, the read operation, the erase operation, and the like. The memory device 1200 may be implemented with a volatile memory device in which stored data is destroyed when the power supply is cut off, or a nonvolatile memory device in which stored data is maintained even though the power supply is cut off. The memory device 1200 may be the semiconductor device having the structure described above with reference to FIGS. 1A to 3B. The memory device 1200 may be the semiconductor device manufactured by the manufacturing method described above with reference to FIGS. 4A to 7B. As an embodiment, the semiconductor memory device may include a stack including alternately stacked conductive layers and insulating layers, a separation insulating structure passing through the stack, and including a line pattern, first protrusion patterns protruded from the line pattern to one side, and second protrusion patterns protruded from the line pattern to another side, first channel structures passing through the stack at the one side of the separation insulating structure and surrounding the first protrusion patterns, respectively, and second channel structures passing through the stack at the another side of the separation insulating structure and surrounding the second protrusion patterns, respectively.

Figure 9:
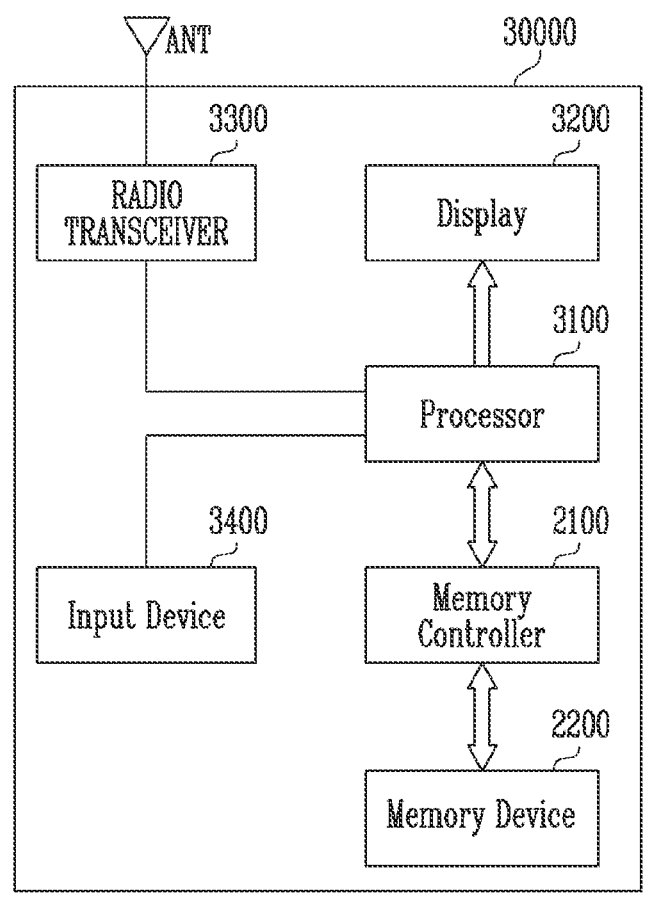
FIG. 9 is a block diagram illustrating a memory system according to an embodiment of the present disclosure.

FIG. 9 is a diagram illustrating a memory system according to an embodiment of the present disclosure.

Referring to FIG. 9, the memory system 30000 may be implemented as a cellular phone, a smart phone, a tablet, a personal computer (PC), a personal digital assistant (PDA), or a wireless communication device. The memory system 30000 may include a memory device 2200 and a memory controller 2100 capable of controlling an operation of the memory device 2200.

The memory controller 2100 may control a data access operation, for example, a program operation, an erase operation, a read operation, or the like, of the memory device 2200 under control of a processor 3100.

Data programmed in the memory device 2200 may be output through a display 3200 under the control of the memory controller 2100.

Through an antenna ANT, a radio transceiver 3300 may transmit and receive a radio signal. For example, the radio transceiver 3300 may convert a radio signal received through the antenna ANT into a signal that may be processed by the processor 3100. Therefore, the processor 3100 may process the signal output from the radio transceiver 3300 and transmit the processed signal to the memory controller 2100 or the display 3200. The memory controller 2100 may transmit the signal processed by the processor 3100 to the memory device 2200. In addition, the radio transceiver 3300 may convert a signal output from the processor 3100 into a radio signal, and output the converted radio signal to an external device through the antenna ANT. An input device 3400 may be a device capable of inputting a control signal for controlling the operation of the processor 3100 or data to be processed by the processor 3100. The input device 3400 may be implemented as a pointing device such as a touch pad or a computer mouse, a keypad, or a keyboard. The processor 3100 may control an operation of the display 3200 so that data output from the memory controller 2100, data output from the radio transceiver 3300, or data output from the input device 3400 is output through the display 3200.

According to an embodiment, the memory controller 2100 capable of controlling the operation of memory device 2200 may be implemented as a part of the processor 3100 and also may be implemented as a chip separate from the processor 3100.

Figure 10:
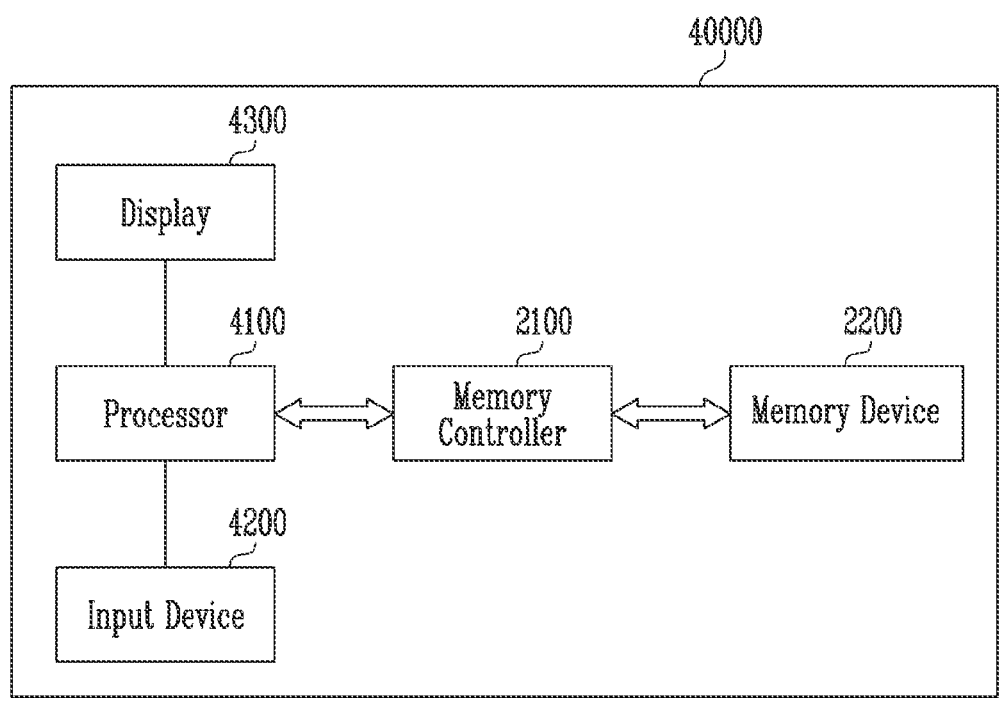
FIG. 10 is a block diagram illustrating a memory system according to an embodiment of the present disclosure.

FIG. 10 is a diagram illustrating a memory system according to an embodiment of the present disclosure.

Referring to FIG. 10, the memory system 40000 may be implemented as a personal computer (PC), a tablet, a netbook, an e-reader, a personal digital assistant (PDA), a portable multimedia player (PMP), an MP3 player, or an MP4 player.

The memory system 40000 may include the memory device 2200 and the memory controller 2100 capable of controlling a data process operation of the memory device 2200.

According to data input through an input device 4200, a processor 4100 may output data stored in the memory device 2200 through a display 4300. For example, the input device 4200 may be implemented as a point device such as a touch pad or a computer mouse, a keypad, or a keyboard.

The processor 4100 may control the overall operation of the memory system 40000 and control the operation of the memory controller 2100. According to an embodiment, the memory controller 2100 capable of controlling the operation of memory device 2200 may be implemented as a part of the processor 4100 or may be implemented as a chip separate from the processor 4100.

Figure 11:
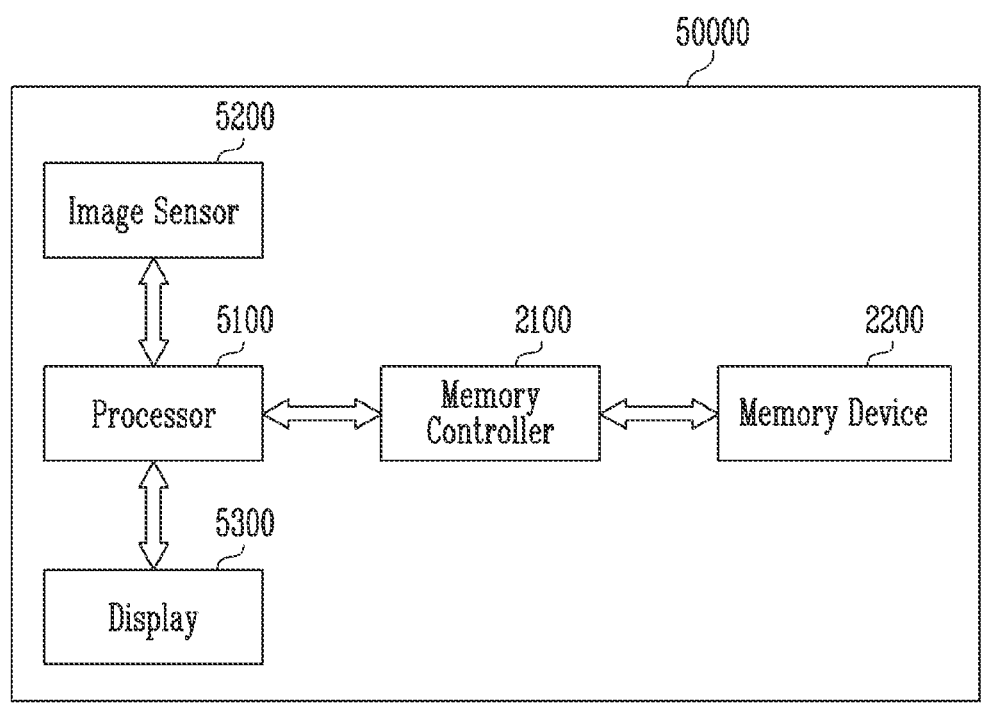
FIG. 11 is a block diagram illustrating a memory system according to an embodiment of the present disclosure.

FIG. 11 is a diagram illustrating a memory system according to an embodiment of the present disclosure.

Referring to FIG. 11, the memory system 50000 may be implemented as an image processing device, for example, a digital camera, a portable phone provided with a digital camera, a smart phone provided with a digital camera, or a tablet provided with a digital camera.

The memory system 50000 may include the memory device 2200 and the memory controller 2100 capable of controlling a data process operation, for example, a program operation, an erase operation, or a read operation, of the memory device 2200.

An image sensor 5200 of the memory system 50000 may convert an optical image into digital signals. The converted digital signals may be transmitted to a processor 5100 or the memory controller 2100. Under the control of the processor 5100, the converted digital signals may be output through a display 5300 or stored in the memory device 2200 through the memory controller 2100. In addition, data stored in the memory device 2200 may be output through the display 5300 under the control of the processor 5100 or the memory controller 2100.

According to an embodiment, the memory controller 2100 capable of controlling the operation of memory device 2200 may be implemented as a part of the processor 5100 or may be implemented as a chip separate from the processor 5100.

Figure 12:
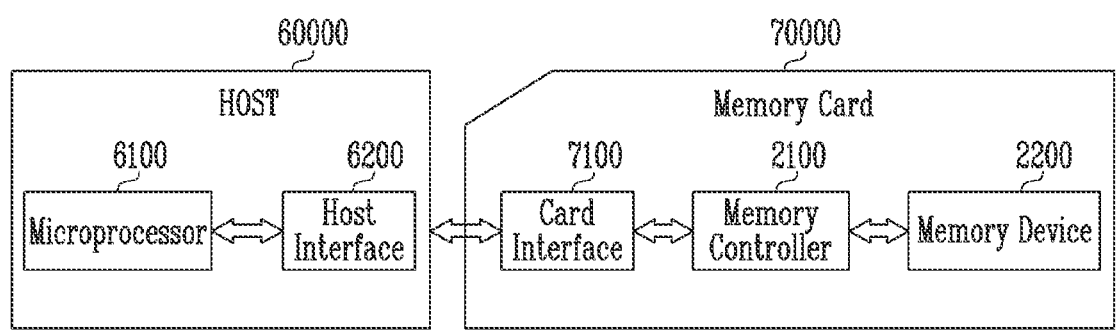
FIG. 12 is a block diagram illustrating a memory system according to an embodiment of the present disclosure.

FIG. 12 is a diagram illustrating a memory system according to an embodiment of the present disclosure.

Referring to FIG. 12, the memory system 70000 may be implemented as a memory card or a smart card. The memory system 70000 may include the memory device 2200, the memory controller 2100, and a card interface 7100.

The memory controller 2100 may control data exchange between the memory device 2200 and the card interface 7100. According to an embodiment, the card interface 7100 may be a secure digital (SD) card interface or a multi-media card (MMC) interface, but is not limited thereto.

The card interface 7100 may interface data exchange between a host 60000 and the memory controller 2100 according to a protocol of the host 60000. According to an embodiment, the card interface 7100 may support a universal serial bus (USB) protocol, and an interchip (IC)-USB protocol. Here, the card interface 7100 may refer to hardware capable of supporting a protocol that is used by the host 60000, software installed in the hardware, or a signal transmission method.

When the memory system 70000 is connected to a host interface 6200 of the host 60000 such as a PC, a tablet, a digital camera, a digital audio player, a mobile phone, a console video game hardware, or a digital set-top box, the host interface 6200 may perform data communication with the memory device 2200 through the card interface 7100 and the memory controller 2100 under control of a microprocessor 6100.

What is claimed is:

1. A semiconductor device comprising:
    a stack including alternately stacked first select lines, word lines, and second select lines, which are spaced apart from each other;
    a separation insulating structure passing through the second select lines, and including a line pattern, first protrusion patterns protruded from the line pattern to one side, and second protrusion patterns protruded from the line pattern to another side, wherein the separation insulating structure is not extended to the word lines and the first select lines;
    first channel structures passing through the stack at the one side of the separation insulating structure and surrounding the first protrusion patterns, respectively; and
    second channel structures passing through the stack at the another side of the separation insulating structure and surrounding the second protrusion patterns, respectively,
    wherein the separation insulating structure passes through a portion of first channel structures adjacent to the separation insulating structure among the first channel structures, and a portion of second channel structures adjacent to the separation insulating structure among the second channel structures.

2. The semiconductor device of claim 1, wherein the first protrusion patterns are arranged symmetrically with the second protrusion patterns.

3. The semiconductor device of claim 1, wherein the first protrusion patterns are arranged asymmetrically with the second protrusion patterns.

4. The semiconductor device of claim 1, wherein the first channel structures are arranged symmetrically with the second channel structures.

5. The semiconductor device of claim 1, wherein the first channel structures are arranged asymmetrically with the second channel structures.

6. The semiconductor device of claim 1, wherein the line pattern extends in a first direction, and the first protrusion patterns and the second protrusion patterns are protruded in a second direction crossing the first direction.

7. The semiconductor device of claim 1, wherein the separation insulating structure passes through the stack at a shallow depth compared to the first channel structures.

8. The semiconductor device of claim 1, further comprising:
    third channel structures passing through the stack at the one side and spaced apart from the first protrusion patterns.

9. The semiconductor device of claim 8, further comprising:
    fourth channel structures passing through the stack at the another side and spaced apart from the second protrusion patterns.

10. The semiconductor device of claim 9, wherein the third channel structures are arranged symmetrically with the fourth channel structures.

11. The semiconductor device of claim 9, wherein the third channel structures are arranged asymmetrically with the fourth channel structures.

12. A semiconductor device comprising:
    first channel structures passing through a stack including lower select lines, upper select lines and word lines between the lower and upper select lines;
    second channel structures passing through the stack; and
    a separation insulating structure passing through the upper select lines, and including a line pattern positioned between the first channel structures and the second channel structures, first protrusion patterns protruded from the line pattern into the first channel structures, and second protrusion patterns protruded from the line pattern into the second channel structures,
    wherein the separation insulating structure passes through a portion of first channel structures adjacent to the separation insulating structure among the first channel structures, and a portion of second channel structures adjacent to the separation insulating structure among the second channel structures.

13. The semiconductor device of claim 12, wherein the first protrusion patterns are arranged symmetrically with the second protrusion patterns.

14. The semiconductor device of claim 12, wherein the first protrusion patterns are arranged asymmetrically with the second protrusion patterns.

15. The semiconductor device of claim 12, wherein the first channel structures are arranged symmetrically with the second channel structures.

16. The semiconductor device of claim 12, wherein the first channel structures are arranged asymmetrically with the second channel structures.

* * * * *